(12) United States Patent
Miyazawa et al.

(10) Patent No.: US 9,905,411 B2
(45) Date of Patent: Feb. 27, 2018

(54) METHOD FOR PROCESSING SEMICONDUCTOR WAFER, METHOD FOR MANUFACTURING BONDED WAFER, AND METHOD FOR MANUFACTURING EPITAXIAL WAFER

(71) Applicant: SHIN-ETSU HANDOTAI CO., LTD., Tokyo (JP)

(72) Inventors: Yuki Miyazawa, Nagano (JP); Takahiro Kida, Chikuma (JP); Tomofumi Takano, Nagano (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 15/505,314

(22) PCT Filed: Aug. 19, 2015

(86) PCT No.: PCT/JP2015/004130
§ 371 (c)(1),
(2) Date: Feb. 21, 2017

(87) PCT Pub. No.: WO2016/038800
PCT Pub. Date: Mar. 17, 2016

(65) Prior Publication Data
US 2017/0301533 A1    Oct. 19, 2017

(30) Foreign Application Priority Data
Sep. 11, 2014  (JP) .................................. 2014-185325

(51) Int. Cl.
*H01L 21/02*    (2006.01)
*H01L 21/67*    (2006.01)
(Continued)

(52) U.S. Cl.
CPC ........ *H01L 21/02024* (2013.01); *B24B 9/065* (2013.01); *B24B 49/04* (2013.01);
(Continued)

(58) Field of Classification Search
None
See application file for complete search history.

(56) References Cited

U.S. PATENT DOCUMENTS

2003/0008478 A1* 1/2003 Abe ........................ B24B 9/065
 438/459
2004/0166783 A1* 8/2004 Kimura ................... B24B 9/065
 451/41
(Continued)

FOREIGN PATENT DOCUMENTS

JP    2001-345435 A    12/2001
JP    2007-273942 A    10/2007
(Continued)

OTHER PUBLICATIONS

Oct. 6, 2015 International Search Report issued in International Patent Application No. PCT/JP2015/004130.

*Primary Examiner* — Asok K Sarkar
(74) *Attorney, Agent, or Firm* — Oliff PLC

(57) ABSTRACT

Method for processing a semiconductor-wafer having a front surface, back surface, and chamfered-portion composed of a chamfered surface on the front surface side, a chamfered surface on the back surface side, and an end face at a peripheral end, including: mirror-polishing of each portion of the chamfered surface on the front surface side, the chamfered surface on the back surface side, the end face, and an outermost peripheral-portion on the front or back surface adjacent to the chamfered surface; wherein the end face mirror-polishing and mirror-polishing of the outermost peripheral-portion on the front or back surface are performed in one step, after step of mirror-polishing the cham- (Continued)

fered surface on the front surface side and step of mirror-polishing the chamfered surface on the back surface side; roll-off amount of the outermost peripheral-portion on the front or back surface is adjusted by one step-performed mirror-polishing of the end face and outermost peripheral-portion.

20 Claims, 8 Drawing Sheets

(51) Int. Cl.
    *B24B 9/06*     (2006.01)
    *B24B 49/04*     (2006.01)
    *H01L 21/66*     (2006.01)
    *H01L 21/762*     (2006.01)

(52) U.S. Cl.
    CPC ........ *H01L 21/67092* (2013.01); *H01L 22/26* (2013.01); *H01L 21/02428* (2013.01); *H01L 21/76254* (2013.01)

(56) References Cited

U.S. PATENT DOCUMENTS

| | | | |
|---|---|---|---|
| 2007/0231931 A1 | 10/2007 | Ecarnot et al. | |
| 2008/0113510 A1* | 5/2008 | Kato | B24B 9/065 438/691 |
| 2009/0163119 A1* | 6/2009 | Yamazaki | B24B 9/065 451/43 |
| 2010/0006982 A1* | 1/2010 | Hashii | B24B 9/065 257/618 |
| 2011/0256815 A1* | 10/2011 | Mizushima | B24B 9/065 451/177 |
| 2011/0294406 A1* | 12/2011 | An | B24B 9/065 451/178 |
| 2013/0264690 A1 | 10/2013 | Masuda et al. | |
| 2014/0264765 A1* | 9/2014 | Masuda | H01L 29/30 257/618 |
| 2016/0172221 A1* | 6/2016 | Takahashi | B24B 9/065 451/5 |
| 2017/0011903 A1* | 1/2017 | Kozasa | B24B 37/02 |

FOREIGN PATENT DOCUMENTS

| | | |
|---|---|---|
| JP | 2012-109310 A | 6/2012 |
| JP | 2013-258227 A | 12/2013 |

* cited by examiner (a)

Prior Art

Prior Art

METHOD FOR PROCESSING SEMICONDUCTOR WAFER, METHOD FOR MANUFACTURING BONDED WAFER, AND METHOD FOR MANUFACTURING EPITAXIAL WAFER

TECHNICAL FIELD

The present invention relates to a method for processing a semiconductor wafer, a method for manufacturing a bonded wafer, and a method for manufacturing an epitaxial wafer.

BACKGROUND ART

As a method for manufacturing an SOI wafer, it has been mainly performed a process in which an ion implanted layer for delamination is formed by implanting mainly hydrogen ions into a bond wafer to form an SOI layer, and the bond wafer is bonded with a base wafer via an insulation film, followed by delaminating the bond wafer along the ion implanted layer for delamination to form a thin film (ion implantation delamination method). This process, however, induces defects on the periphery in delaminating the bond wafer. As a solution for such defects on the periphery, it is known to form a sag shape (a shape which has a positive roll-off amount) at the outermost peripheral portion on the side to which a wafer for bonding (a bond wafer and a base wafer) is bonded (Patent Document 1).

In manufacturing an epitaxial wafer, the outermost peripheral portion tends to be a rise shape (a shape which has a negative roll-off amount) when an epitaxial layer is formed on a substrate for epitaxial growth (also referred to as an epi-sub). Accordingly, it has been desired to control the flatness after forming an epitaxial layer by previously forming a sag shape at a portion to be formed the rise shape on the substrate for epitaxial growth.

Accordingly, in prior manufacturing of the wafer for bonding and the substrate for epitaxial growth, the polishing time has been extended in the step of polishing a main surface of a wafer to form a sag shape. In such a method, however, the shape of an internal side from the outermost peripheral portion is degraded by extending the time for polishing a main surface of the wafer to form the sag shape. The degradation of a shape in this context is expressed by an SFQRmax value, which is the maximum value of flatness SFQR (Site Front least sQuares Range), for example, and larger SFQRmax value means that the shape of the internal side from the outermost peripheral portion is degraded more severely. Generally, smaller flatness SFQRmax is preferable since large SFQRmax causes degradation of defocus in a device process. Accordingly, it has been desired a method that can form a desired sag shape with high accuracy without deforming the shape of the internal side from the outermost peripheral portion (without increasing the flatness SFQRmax).

As a solution for the foregoing problem, Patent Document 2 describes a method for manufacturing a substrate for epitaxial growth without extending time for polishing a main front surface of a semiconductor wafer to form a sag shape. Specifically, this method is a method as shown in FIGS. 13 (a) and (b), in which each of the quartered regions of a semiconductor wafer 101 including a chamfered portion 108 composed of a chamfered surface on the front surface side 102, a chamfered surface on the back surface side 103, together with an end face, and an outermost peripheral portion adjacent to the chamfered surface on the back surface side 103 is polished with a polishing apparatus provided with four respective polishing pads (a polishing pad 104 for the chamfered surface on the front surface side, a polishing pad 105 for the chamfered surface on the back surface side, a polishing pad 106 for the end face, and a polishing pad 107 for the outermost peripheral portion on the back surface). This can form a sag shape while mirror-polishing the chamfered portion 108. Although such a method can polish the quartered regions adjacent to the chamfered portion at once, it makes the end shape of the chamfered portion of the semiconductor wafer 101 (the shape of the end face 109) be sharp as shown in FIG. 15. When a wafer processed by this method is used as a wafer for bonding, for example, stress concentration occurs at the tip end of the chamfered portion to cause faults of frequent breakage when centrifugal force occurs in ion implantation of a subsequent step.

CITATION LIST

Patent Literature

Patent Document 1: Japanese Unexamined Patent publication (Kokai) No. 2007-273942
Patent Document 2: Japanese Unexamined Patent publication (Kokai) No. 2012-109310

SUMMARY OF INVENTION

Technical Problem

The present invention was accomplished in view of the above-described problems. It is an object of the present invention to provide a method for processing a semiconductor wafer which can form a desired sag shape on the outermost peripheral portion with high accuracy without deforming the shape of the internal side from the outermost peripheral portion of the semiconductor wafer and can process the semiconductor wafer so as not to have a sharp edge shape after the processing.

Solution to Problem

To solve the foregoing problems, the present invention provides a method for processing a semiconductor wafer having a front surface, a back surface, and a chamfered portion at a peripheral end of the semiconductor wafer, with the chamfered portion including a chamfered surface on a side of the front surface, a chamfered surface on a side of the back surface, and an end face, comprising:

mirror-polishing of each portion of the chamfered surface on the side of the front surface, the chamfered surface on the side of the back surface, the end face, and an outermost peripheral portion on the front surface or the back surface adjacent to the chamfered surface;

wherein the mirror-polishing of the end face and the mirror-polishing of the outermost peripheral portion on the front surface or the back surface are performed as a one step-performed mirror-polishing, after a step of mirror-polishing the chamfered surface on the side of the front surface and a step of mirror-polishing the chamfered surface on the side of the back surface, and a roll-off amount of the outermost peripheral portion on the front surface or the back surface is adjusted by the one step-performed mirror-polishing of the end face and the outermost peripheral portion.

Such a method for processing a semiconductor wafer can form a desired sag shape at the outermost peripheral portion with high accuracy without deforming the shape of the internal side from the outermost peripheral portion of the semiconductor wafer, and can process the semiconductor wafer so as not to have a sharp edge shape after the processing. Incidentally, the outermost peripheral portion of the present invention refers to any area of a wafer up to about 30 mm from the end face in a radial direction, and this area differs on the basis of specifications of a user.

The one step-performed mirror-polishing of the end face and the outermost peripheral portion is preferably performed with a polishing apparatus provided with one or more polishing pieces (A) to mirror-polish the end face and one or more polishing pieces (B) to mirror-polish the outermost peripheral portion on the front surface or the back surface with the both pieces being arranged to surround the semiconductor wafer, by rotating the semiconductor wafer relatively to the polishing pieces (A) and (B).

Such a method can perform the mirror-polishing of the end face and the outermost peripheral portion in one step and more easily.

The roll-off amount is preferably adjusted with the polishing apparatus provided with the plurality of polishing pieces (B), and by altering the number of the polishing pieces (B) being in contact with the outermost peripheral portion on the front surface or the back surface.

Such a method can adjust the roll-off amount of the outermost peripheral portion on the front surface or the back surface of the semiconductor wafer more easily.

The one step-performed mirror-polishing of the end face and the outermost peripheral portion is preferably performed with the polishing apparatus provided with 12 pieces or more in total of the polishing pieces (A) and the polishing pieces (B).

By using such a polishing apparatus, it is possible to adjust the roll-off amount of the outermost peripheral portion on the front surface or the back surface of the semiconductor wafer more finely.

The roll-off amount can be adjusted by a method in which
the one step-performed mirror-polishing of the end face and the outermost peripheral portion includes measuring of the roll-off amount; and
if the measured roll-off amount does not coincide with a desired value, the one step-performed mirror-polishing of the end face and the outermost peripheral portion including the measuring of the roll-off amount is repeated while adjusting polishing conditions of the one step-performed mirror-polishing of the end face and the outermost peripheral portion; and then
if the measured roll-off amount coincides with a desired value, the one step-performed mirror-polishing of the end face and the outermost peripheral portion is finished.

It is also possible to perform a step of forming an epitaxial layer on the front surface of the semiconductor wafer, after the step of mirror-polishing the chamfered surface on the side of the front surface and the step of mirror-polishing the chamfered surface on the side of the back surface, and before the one step-performed mirror-polishing of the end face and the outermost peripheral portion on the front surface or the back surface.

Such a method can adjust the roll-off amount of the peripheral portion of an epitaxial wafer when the epitaxial wafer is produced by epitaxial growth on a semiconductor wafer in which the chamfered surface is mirror-polished.

Accordingly, it is possible to reduce the rise shape, which are liable to form in an epitaxial wafer, and to obtain an epitaxial wafer with the outermost peripheral portion having a good flatness.

The present invention also provides a method for manufacturing a bonded wafer, wherein the bonded wafer is manufactured by an ion implantation delamination method using a semiconductor wafer, with the roll-off amount of the outermost peripheral portion on the front surface or the back surface being adjusted by the foregoing method for processing a semiconductor wafer, as either or both of a bond wafer and a base wafer; and using the surface with the roll-off amount being adjusted as a bonding surface.

Such a method for manufacturing a bonded wafer can manufacture a bonded wafer with suppressing occurrence of defects on the periphery in delaminating the bond wafer by bonding a wafer for bonding in which a desired sag shape is formed on the outermost peripheral portion.

The present invention also provides a method for manufacturing an epitaxial wafer, comprising flattening of an outermost peripheral portion of a semiconductor wafer by the foregoing method for processing a semiconductor wafer, wherein the semiconductor wafer has an epitaxial layer formed on a front surface thereof, and has a negative roll-off amount of the outermost peripheral portion thereof on a side of the front surface having the epitaxial layer formed thereon.

Such a method for manufacturing an epitaxial wafer can manufacture an epitaxial wafer in which the outermost peripheral portion has controlled flatness by polishing a rise shape, which is formed at the outermost peripheral portion of the epitaxial wafer by forming the epitaxial layer.

The present invention further provides a method for manufacturing an epitaxial wafer, comprising:
processing a semiconductor wafer by the foregoing method for processing a semiconductor wafer to adjust the outermost peripheral portion on the front surface to have a positive roll-off amount, and
forming an epitaxial layer on the front surface of the semiconductor wafer.

Such a method for manufacturing an epitaxial wafer can manufacture an epitaxial wafer in which the outermost peripheral portion has controlled flatness by previously forming a desired sag shape at the portion to be formed a rise shape on the substrate for epitaxial growth.

Advantageous Effects of Invention

As described above, the inventive method for processing a semiconductor wafer can form a desired sag shape on the outermost peripheral portion with high accuracy without deforming the shape of the internal side from the outermost peripheral portion of the semiconductor wafer by adjusting the roll-off amount of the outermost peripheral portion, and can process the semiconductor wafer so as not to have a sharp edge shape after the processing. By applying this method for processing a semiconductor wafer to the manufacture of a bonded wafer, it is possible to manufacture a bonded wafer with suppressing occurrence of defects on the periphery in delaminating the bond wafer. Furthermore, by applying such a method for processing a semiconductor wafer to the manufacture of an epitaxial wafer, it is also possible to manufacture an epitaxial wafer in which the outermost peripheral portion has controlled flatness.

DESCRIPTION OF EMBODIMENTS

As described above, it has been desired to develop a method for processing a semiconductor wafer which can form a desired sag shape at the outermost peripheral portion with high accuracy without deforming the shape of the internal side from the outermost peripheral portion of the semiconductor wafer and can process the semiconductor wafer so as not to have a sharp edge shape after the processing.

The present inventors has diligently studied to accomplish the above-mentioned objects and consequently found that in mirror-polishing of four regions of a semiconductor wafer, including a chamfered portion divided to three regions, namely a chamfered surface on the front surface side, a chamfered surface on the back surface side, and an end face, together with an outermost peripheral portion on the front surface or the back surface adjacent to the chamfered surface; it is possible to form a desired sag shape with high accuracy without deforming the shape of the internal side from the outermost peripheral portion of the semiconductor wafer and to prevent sharpening of the end face of the semiconductor wafer after the processing by mirror-polishing these regions in three steps such as (1) the chamfered surface on the front surface side, (2) the chamfered surface on the back surface side, and (3) the end face and the outermost peripheral portion; thereby brought the present invention to completion.

That is, the present invention is a method for processing a semiconductor wafer having a front surface, a back surface, and a chamfered portion at a peripheral end of the semiconductor wafer, with the chamfered portion including a chamfered surface on a side of the front surface, a chamfered surface on a side of the back surface, and an end face, comprising:

mirror-polishing of each portion of the chamfered surface on the side of the front surface, the chamfered surface on the side of the back surface, the end face, and an outermost peripheral portion on the front surface or the back surface adjacent to the chamfered surface;

wherein the mirror-polishing of the end face and the mirror-polishing of the outermost peripheral portion on the front surface or the back surface are performed as a one step-performed mirror-polishing, after a step of mirror-polishing the chamfered surface on the side of the front surface and a step of mirror-polishing the chamfered surface on the side of the back surface, and a roll-off amount of the outermost peripheral portion on the front surface or the back surface is adjusted by the one step-performed mirror-polishing of the end face and the outermost peripheral portion.

Hereinafter, the present invention will be described specifically with referring to FIGS., but the present invention is not limited thereto.

[Method for Processing Semiconductor Wafer]

Figure 1:
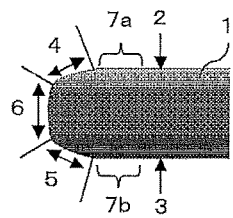
FIG. 1 is a cross-sectional view showing each stage in a flow of an example of the inventive method for processing a semiconductor wafer.
Figure 1:
Figure 1:
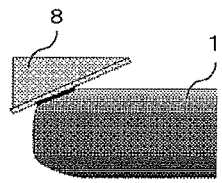

An example of the inventive method for processing a semiconductor wafer is described with referring to FIG. 1. In this method for processing a semiconductor wafer, mirror-polishing of a semiconductor wafer 1 shown in FIG. 1 (*a*) is performed. The semiconductor wafer 1 has a front surface 2, a back surface 3, and a chamfered portion at the peripheral end composed of a chamfered surface 4 on the front surface side, a chamfered surface 5 on the back surface side, and an end face 6, together with an outermost peripheral portion 7*a* on the front surface adjacent to the chamfered surface 4 on the front surface side and an outermost peripheral portion 7*b* on the back surface side adjacent to the chamfered surface 5 on the back surface side. The chamfered portion refers to a portion subjected to chamfering process. The chamfered surface 4 on the front surface side and the chamfered surface 5 on the back surface side are portions composing nearly inclined surfaces with respect to the front surface 2 and the back surface 3. The end face 6 is a portion of the chamfered portion except for the chamfered surface 4 on the front surface side and the chamfered surface 5 on the back surface side, and almost perpendicular to the front surface 2 and the back surface 3. Provided that, the end face 6 may be slightly curved. The chamfered surface 4 on the front surface side, the chamfered surface 5 on the back surface side, and the end face 6 are generally formed to have a smooth boundary as shown in FIG. 1 (*a*). Each of the outermost peripheral portion 7*a* on the front surface and the outermost peripheral portion 7b on the back surface composes each part of the front surface 2 and the back surface 3 in the same plane respectively. Provided that, they may have slight sag or rise toward the peripheral edge.

In the method for processing a semiconductor wafer of FIG. 1, first, the chamfered surface 4 on the front surface side is mirror-polished with a polishing apparatus provided with a polishing piece 8 to mirror-polish the chamfered surface on the front surface side (FIG. 1 (b), step (1)). Then, the chamfered surface 5 on the back surface side is mirror-polished with a polishing apparatus provided with a polishing piece 9 to mirror-polish the chamfered surface on the back surface side (FIG. 1 (c), step (2)). Subsequently, mirror-polishing of the end face 6 and mirror-polishing of the outermost peripheral portion 7a on the front surface are performed in one step with a polishing apparatus provided with a polishing piece 10 to mirror-polish the end face and a polishing piece 11 to mirror-polish the outermost peripheral portion on the front surface, and the roll-off amount of the outermost peripheral portion 7a on the front surface is adjusted thereby (FIG. 1 (d), step (3)).

It is to be noted that, (1) the step of mirror-polishing the chamfered surface 4 on the front surface side and (2) the step of mirror-polishing the chamfered surface 5 on the back surface side can be performed separately or simultaneously. When they are performed separately, either step may be performed earlier.

FIG. 1 (d) shows a case in which the outermost peripheral portion 7a on the front surface is mirror-polished together with the end face 6 as the step (3). In this step (3), however, it is possible to mirror-polish the outermost peripheral portion 7b on the back surface instead of the outermost peripheral portion 7a on the front surface by using a polishing piece to mirror-polish the outermost peripheral portion on the back surface instead of the polishing piece 11 to mirror-polish the outermost peripheral portion on the front surface.

Figure 2:
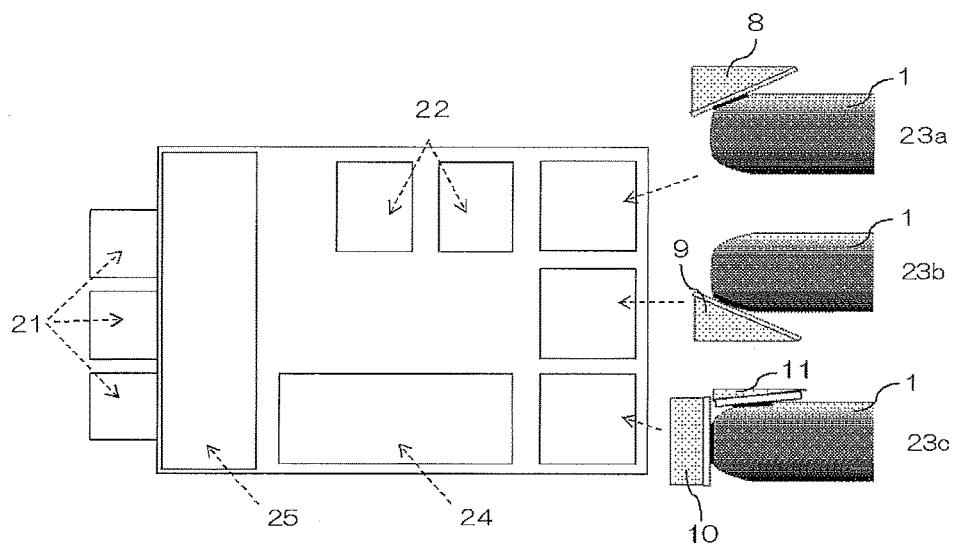
FIG. 2 is a schematic diagram showing an example of a processing equipment used for the inventive method for processing a semiconductor wafer.

More specifically, these inventive method for processing a semiconductor wafer can be performed with a processing equipment shown in FIG. 2, for example. The processing equipment shown in FIG. 2 is provided with loaders/unloaders 21, a polishing unit 22 for a notch, a polishing unit 23a for the chamfered surface on the front surface side, a polishing unit 23b for the chamfered surface on the back surface side, a polishing unit 23c for the end face and the outermost peripheral portion, a cleaning unit 24, and an area 25 for operating a robot. In this processing equipment, the chamfered surface 4 on the front surface side is mirror-polished with the polishing unit 23a for the chamfered surface on the front surface side (step (1)), and then the chamfered surface 5 on the back surface side is mirror-polished with the polishing unit 23b for the chamfered surface on the back surface side (step (2)), and after that, the end face 6 and the outermost peripheral portion 7a on the front surface are mirror-polished with the polishing unit 23c for the end face and the outermost peripheral portion (step (3)).

Figure 14:
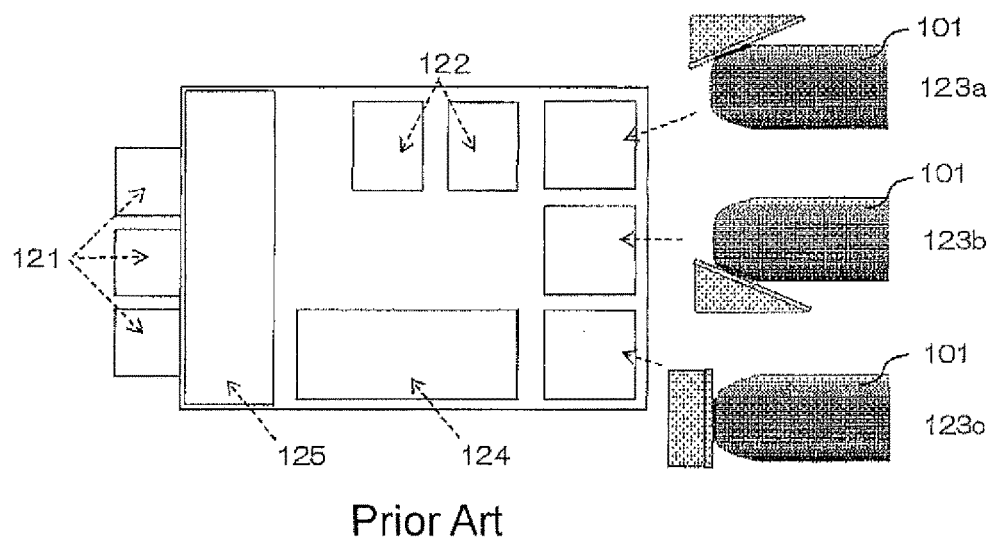
FIG. 14 is a schematic diagram showing an example of a processing equipment used for a prior method for processing a semiconductor wafer.

In the prior method for polishing a semiconductor wafer, processing of a semiconductor wafer 101 has been performed by using a polishing equipment shown in FIG. 14, for example, provided with loaders/unloaders 121, a polishing unit 122 for a notch, a polishing unit 123a for the chamfered surface on the front surface side, a polishing unit 123b for the chamfered surface on the back surface side, a polishing unit 123c for the end face, a cleaning unit 124, and an area 125 for operating a robot. On the other hand, in the inventive method for processing a semiconductor wafer, since the mirror-polishing of the end face and the mirror-polishing of the outermost peripheral portion are performed in the same step as described above, it is preferable to perform the process by using a processing equipment provided with the polishing unit 23c for the end face and the outermost peripheral portion as shown in FIG. 2 instead of the polishing unit 123c for the end face (FIG. 14).

Figure 3:
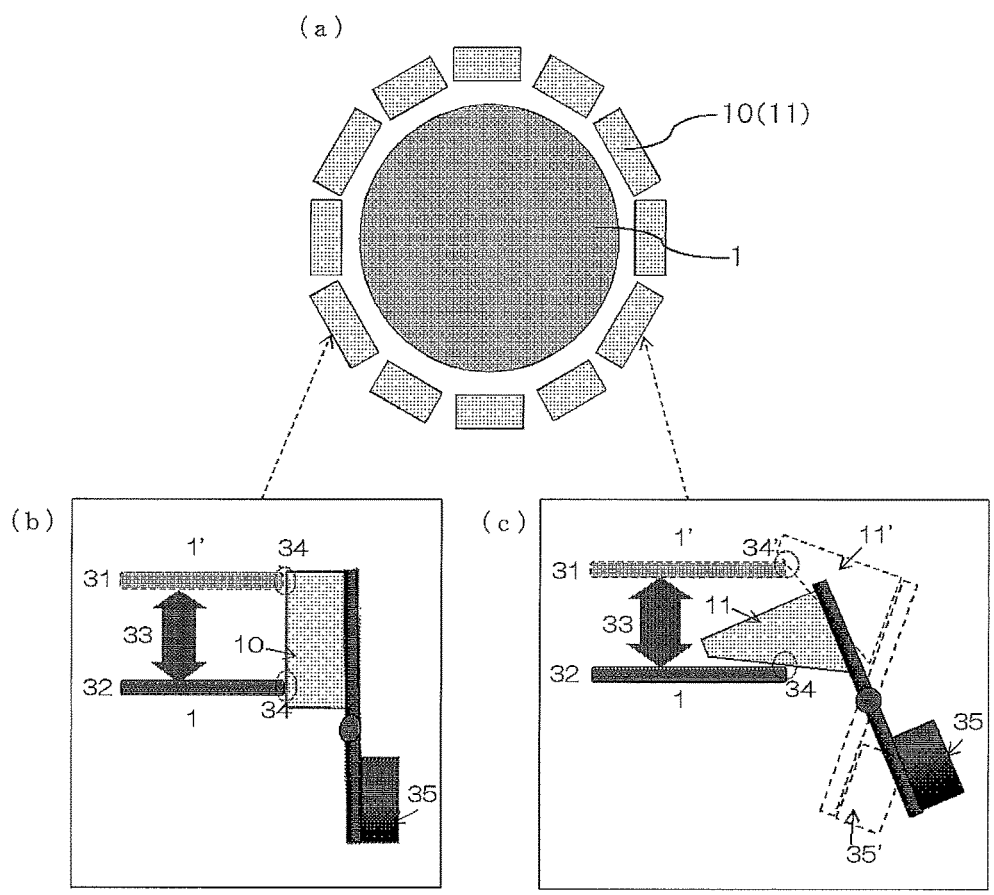
FIG. 3 is a schematic diagram showing an example of a polishing apparatus used for mirror-polishing of the end face and the outermost peripheral portion in the present invention.

The foregoing one step-performed mirror-polishing of the end face and the outermost peripheral portion is preferably performed with a polishing apparatus provided with one or more polishing pieces 10 to mirror-polish the end face (hereinafter, referred to as polishing pieces (A)) and one or more polishing pieces 11 to mirror-polish the outermost peripheral portion on the front surface (or the back surface) (hereinafter, referred to as polishing pieces (B)) with the both pieces being arranged to surround the semiconductor wafer as shown in FIGS. 3 (a) to (c), for example, by rotating the semiconductor wafer 1 relatively to the polishing pieces (A) and (B). Such a method can easily mirror-polish the end face and the outermost peripheral portion in the same step.

FIG. 3 (a) shows a general view of a polishing apparatus. FIG. 3 (b) is a schematic cross-sectional diagram showing mirror-polishing of the end face of the semiconductor wafer 1 with the polishing pieces (A). FIG. 3 (c) is a schematic cross-sectional diagram showing mirror-polishing of the outermost peripheral portion on the front surface of the semiconductor wafer 1 with the polishing pieces (B).

The mirror-polishing of the semiconductor wafer can be performed by rotating the polishing pieces (A) and (B), by rotating the semiconductor wafer, or by performing the both.

The width (in the radial direction) of the outermost peripheral portion of the semiconductor wafer to be in contact with the polishing pieces (B) is preferably set to about 30 mm from the end face at maximum.

As shown in FIG. 3 (c), it is possible to control an angle between the polishing pieces 11 (or 11') to mirror-polish the outermost peripheral portion on the front surface and the contact portion 34 (or 34') of the semiconductor wafer 1 (or 1') by moving the semiconductor wafer 1 upward and downward from the upper end 31 to the lower end 32 with a fluctuation width 33 and changing this fluctuation width, and it is possible to adjust the roll-off amount thereby. The roll-off amount can be adjusted by adjusting the angle of the polishing pieces 11 (or 11') itself, a weight 35 (or 35'), and polishing time. Also in this case, the end face can be mirror-polished depending on the position of the semiconductor wafer 1 (e.g., the upper end 31 and the lower end 32) as shown in FIG. 3 (b).

It is also possible to adjust the roll-off amount by using the polishing apparatus provided with the plurality of polishing pieces (B) and altering the number of the polishing pieces (B) being in contact with the outermost peripheral portion on the front surface or the back surface. Such a method can easily adjust the roll-off amount of the outermost peripheral portion on the front surface or the back surface of the semiconductor wafer, and is preferable thereby.

Incidentally, when altering the number of the polishing pieces (B) being in contact with the outermost peripheral portion on the front surface or the back surface, it is possible to alter the number of the attached polishing pieces (B) (manual adjustment), or to alter the number of the polishing pieces (B) to be in contact with the outermost peripheral portion by using a stopper (automatic adjustment) without altering the number of the attached pieces.

In the foregoing manual adjustment, the roll-off amount can be adjusted as shown in Table 1, for example.

TABLE 1

| Roll-off amount (nm) | Number of attached pieces | | | Number of pieces in contact with outermost peripheral portion |
|---|---|---|---|---|
| | End face (A) | Outermost peripheral portion (B) | Sum | |
| 0 | 12 | 0 | 12 | 0 |
| 160 | 10 | 2 | 12 | 2 |
| 300 | 8 | 4 | 12 | 4 |
| . | . | . | . | . |
| . | . | . | . | . |
| . | . | . | . | . |

In the foregoing automatic adjustment, the roll-off amount can be adjusted as shown in Table 2, for example.

TABLE 2

| Roll-off amount (nm) | Number of attached pieces | | | Number of pieces in contact with outermost peripheral portion |
|---|---|---|---|---|
| | End face (A) | Outermost peripheral portion (B) | Sum | |
| 0 | 6 | 6 | 12 | 0 |
| 160 | 6 | 6 | 12 | 2 |
| 300 | 6 | 6 | 12 | 4 |
| . | . | . | . | . |
| . | . | . | . | . |
| . | . | . | . | . |

It is also possible to finely adjust the roll-off amount of the outermost peripheral portion on the front surface or the back surface of the semiconductor wafer by using a polishing apparatus provided with 12 pieces or more in total of the polishing pieces 10 to mirror-polish the end face (the polishing pieces (A)) and the polishing piece 11 to mirror-polish the outermost peripheral portion on the front surface (or the back surface) (the polishing pieces (B)) as shown in FIG. 3 (a).

Figure 4:
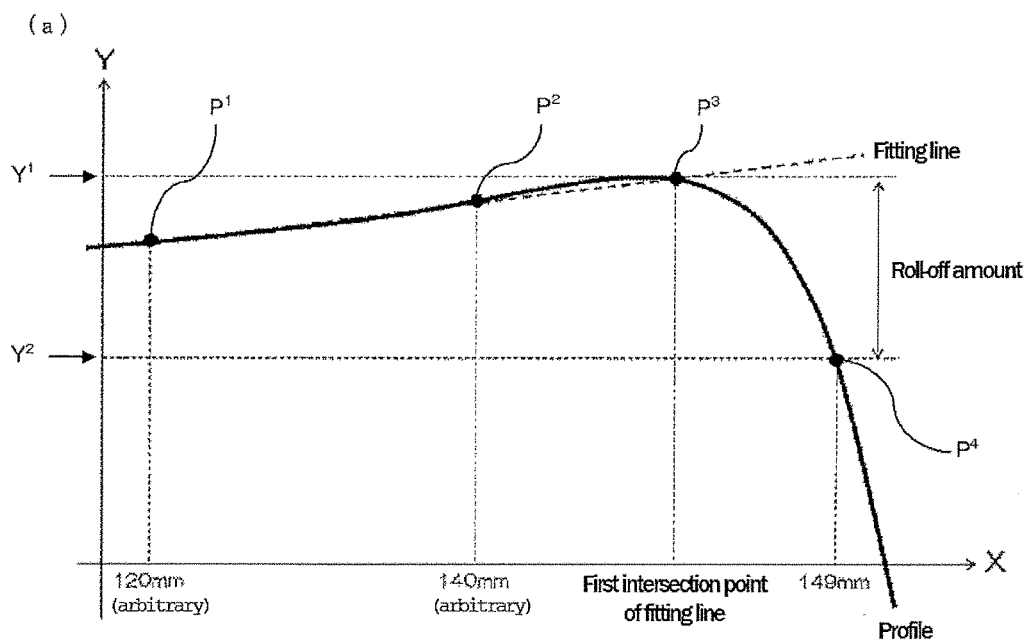
FIG. 4 (*a*) is an explanatory diagrams showing an example of a definition of roll-off amount; (b) is an explanatory diagrams showing another example of the definition of roll-off amount.
Figure 4:
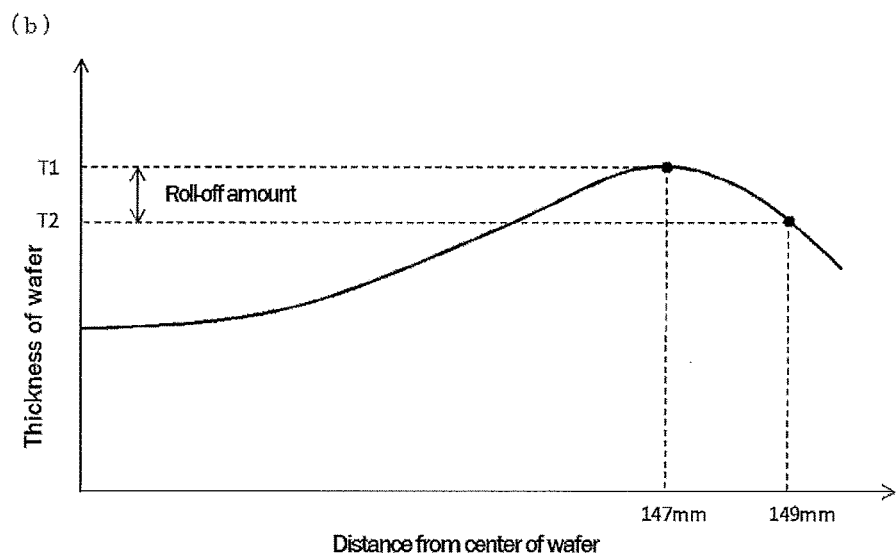

Herein, the roll-off amount is described with referring to FIG. 4. FIG. 4 (a) is a diagram showing a definition of a roll-off amount used in Dynasearch (manufactured by Raytex Corporation), which is a shape measuring apparatus, and the roll-off amount is explained with exemplifying a semiconductor wafer with a diameter of 300 mm (the length from the peripheral end to the center of the semiconductor wafer is 150 mm). The front surface of the semiconductor wafer is determined as a surface to be measured, and a fitting line is determined to be a line connecting the two points on the front surface of the semiconductor wafer apart from the peripheral end of the semiconductor wafer by arbitrary distance toward the center on the cross-sectional shape ("profile" in FIG. 4 (a)) on the front surface side of the semiconductor wafer (in FIG. 4 (a), point $P^1$ and point $P^2$ apart from the center of the semiconductor wafer by 120 mm and 140 mm respectively). Then, from the height ($Y^1$) of the first intersection point $P^3$ of the fitting line and the cross-sectional shape at the peripheral edge side, the height ($Y^2$) of the point $P^4$ at the position apart from the peripheral edge of the semiconductor wafer by 1 mm on the cross-sectional shape is subtracted. This remainder is defined as the roll-off amount of this semiconductor wafer. It is to be noted that the distance of the measuring point $P^4$ from the peripheral edge of a semiconductor wafer is not limited to 1 mm, and can be 0.5 mm, for example. A positive value of the roll-off amount expresses a sag shape, and a negative value of the roll-off amount expresses a rise shape.

FIG. 4 (b) is a diagram showing an example of a definition of the roll-off amount used in a shape measuring apparatus installed in a polishing apparatus used for mirror-polishing. As shown in this diagram, the roll-off amount can be simply defined as a difference of wafer thicknesses between the two arbitrary points on the periphery portion. In this case, the roll-off amount expresses the difference between the wafer thicknesses T1 and T2 (T2−T1) at two arbitrary points on the periphery portion (e.g., at positions of 147 mm and 149 mm from the center of the wafer).

In the inventive method for processing a semiconductor wafer, it is preferable to adjust the roll-off amount by a method in which the one step-performed mirror-polishing of the end face and the outermost peripheral portion includes measuring of the roll-off amount; and if the measured roll-off amount does not coincide with a desired value, the one step-performed mirror-polishing of the end face and the outermost peripheral portion including the measuring of the roll-off amount is repeated while adjusting polishing conditions of the one step-performed mirror-polishing of the end face and the outermost peripheral portion; and then if the measured roll-off amount coincides with a desired value, the one step-performed mirror-polishing of the end face and the outermost peripheral portion is finished.

Figure 5:
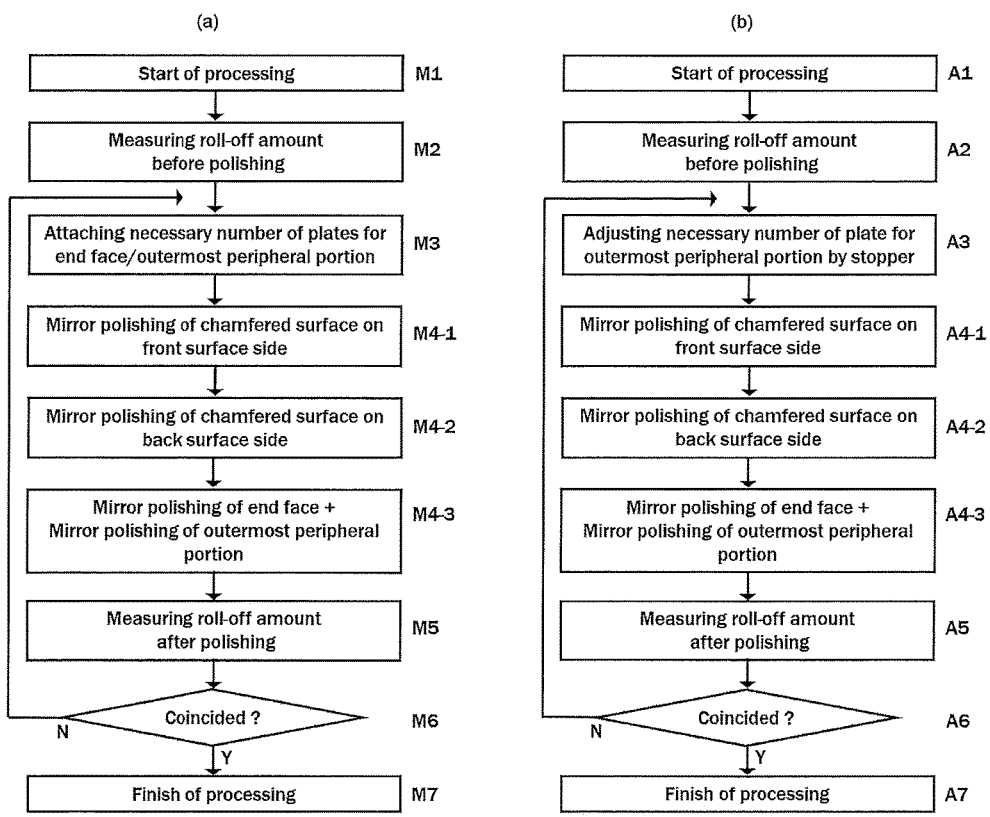
FIG. 5 are flow diagrams showing each example of the inventive method for processing a semiconductor wafer in which (a) the number of the contact polishing pieces (B) is altered by manual adjustment, and (b) the number of the contact polishing pieces (B) is altered by automatic adjustment.

That is, the inventive method for processing a semiconductor wafer is preferably performed in line with a flow shown in FIG. 5 (a) or FIG. 5 (b), for example. FIG. 5 (a) shows an example of the flow in case of altering the number of the contact polishing pieces (B) by manual adjustment, and FIG. 5 (b) shows an example of the flow in case of altering the number of the contact polishing pieces (B) by automatic adjustment.

In the flow of FIG. 5 (a), the processing is started (M1), and the roll-off amount before polishing is measured at first (M2). Then, the number of polishing pieces for the end face and for the outermost peripheral portion are decided, and they are attached to a polishing apparatus (M3). Subsequently, mirror-polishing of the chamfered surface on the front surface side (M4-1), mirror-polishing of the chamfered surface on the back surface side (M4-2), and mirror-polishing of the end face and the outermost peripheral portion (M4-3) are performed. Then, the roll-off amount at this point (roll-off amount after polishing) is measured (M5) to decide whether the measured roll-off amount after polishing coincides with a desired value or not (M6). If the measured roll-off amount coincides with the desired value, the processing is finished (M7); if the roll-off amount does not coincide with the desired value, the step of deciding the number of the polishing pieces for the end face and for the outermost peripheral portion and attaching the polishing pieces to the polishing apparatus (M3), is performed again. Subsequently, mirror-polishing of steps (M4-1) to (M4-3) are performed again, although it is possible to perform the step (M4-3) solely in this case, with omitting the step (M4-1) and the step (M4-2). Then, the roll-off amount after polishing is measured (M5) again to determine whether the measured roll-off amount after the polishing coincides with the desired value or not (M6). After that, the same steps are repeated until the desired roll-off value is attained.

The foregoing explanation of a flow mainly described the determination of the polishing pieces for the end face and for the outermost peripheral portion in the step M3 to attain the desired roll-off amount. The roll-off amount, however, changes due to processing conditions other than the number of the polishing pieces (such as polishing time, rotation speed). Accordingly, these processing conditions have to be determined before get into the step M4-3.

Therefore, by calculating the change of a roll-off by the processing of the step M4-3 from the roll-off amount before polishing determined in the step M2 and the roll-off amount after polishing determined in the step M5, and by feedback of the result to the step M3 in next time, it is possible to optimize the processing conditions (number of pieces, polishing time, rotation speed, etc.) in the step M3 after the second time of processing of the same wafer or in the step M3 of processing of another wafer.

The flow (A1 to A7) of FIG. 5 (b) is the same with the flow (M1 to M7) of FIG. 5 (a), except for performing the step to alter the number of the polishing pieces (B) to be in contact with the outermost peripheral portion by using a stopper (automatic adjustment) (A3) instead of the step to decide the number of polishing pieces for the end face and the outermost peripheral portion and to attach them to a polishing apparatus (M3) in the foregoing flow of FIG. 5 (a).

In this manner, it is possible to form a desired sag shape on the outermost peripheral portion of a semiconductor wafer with more accuracy by performing the inventive method for processing a semiconductor wafer in line with a flow of FIG. 5 (a) or FIG. 5 (b).

As described above, the inventive method for processing a semiconductor wafer can form a sag shape at the outermost peripheral portion without extending polishing time in a CMP (chemical mechanical polishing) step (i.e., a step of polishing the main front surface). Accordingly, it is possible to form a desired sag shape on the outermost peripheral portion with high accuracy by adjusting the roll-off amount of the outermost peripheral portion without deforming the shape (the flatness SFQRmax) of the internal side from the outermost peripheral portion of the semiconductor wafer.

Figure 12:
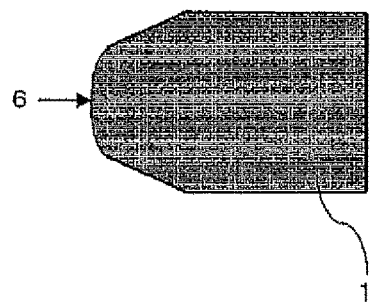
FIG. 12 is a schematic cross-sectional diagram showing a cross-sectional shape of a chamfered portion of a semiconductor wafer processed by the inventive method for processing a semiconductor wafer.
Figure 13:
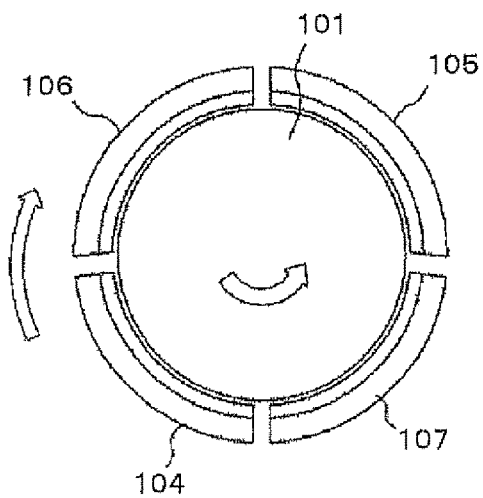
FIG. 13 are schematic diagrams showing an example of a polishing apparatus used for a prior method for processing a semiconductor wafer; (a) is a diagram of the main face side of a semiconductor wafer, and (b) is a schematic diagram showing a position of each polishing pad with respect to the semiconductor wafer.
Figure 13:
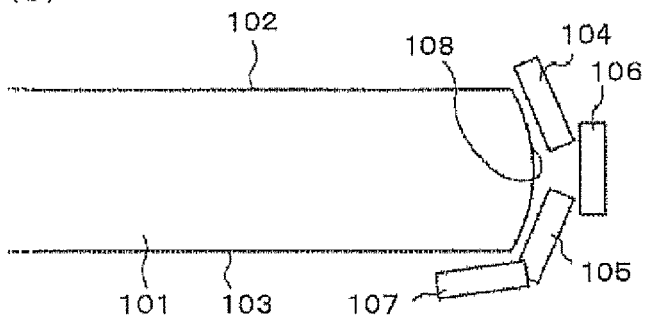
Figure 15:
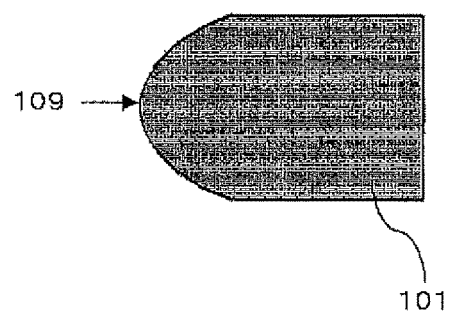
FIG. 15 is a schematic cross-sectional diagram showing the cross-sectional shape of the chamfered portion of a semiconductor wafer processed by a prior method for processing a semiconductor wafer.

As mentioned above, in the prior method for processing a semiconductor wafer, the end face 6 of the semiconductor wafer 1 after processing has a sharp edge shape as shown in FIG. 15, and faults of breakage have been frequently occurred. The inventive method for processing a semiconductor wafer, however, can process the end face 6 of the semiconductor wafer 1 after processing to have a shape which is not sharp as in FIG. 12, and can suppress occurrence of breakage thereby.

[Method for Manufacturing Bonded Wafer]

The present invention provides a method for manufacturing a bonded wafer, wherein the bonded wafer is manufactured by an ion implantation delamination method using a semiconductor wafer, with the roll-off amount of the outermost peripheral portion on the front surface or the back surface being adjusted by the foregoing method for processing a semiconductor wafer, as either or both of a bond wafer and a base wafer; and using the surface with the roll-off amount being adjusted as a bonding surface.

Figure 7:
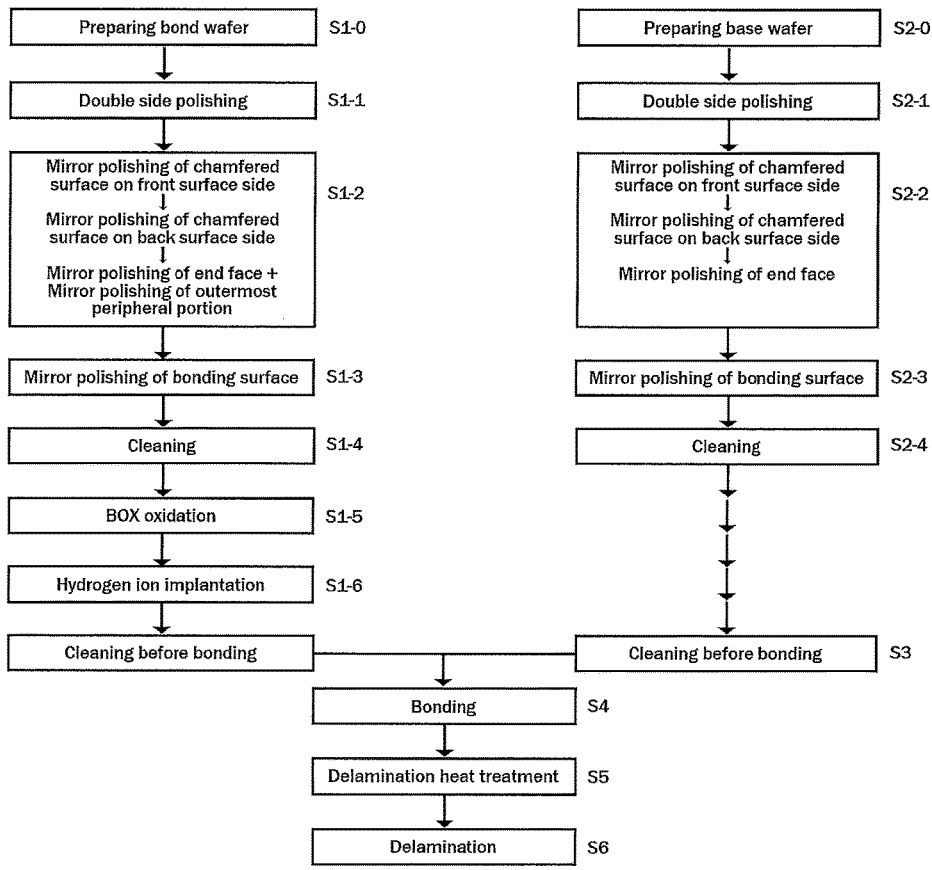
FIG. 7 is a flow diagram showing an example of the inventive method for manufacturing a bonded wafer.

Such inventive method for manufacturing a bonded wafer is preferably performed in line with a flow shown in FIG. 7, for example.

In the flow of FIG. 7, a bond wafer is prepared (S1-0), and double-side polished (S1-1) at first. Then, the bond wafer is subjected to mirror-polishing of the chamfered surface on the front surface side, mirror-polishing of the chamfered surface on the back surface side, and one step-performed mirror-polishing of the end face and the outermost peripheral portion by the inventive method for processing a semiconductor wafer, and the roll-off amount of the outermost peripheral portion is adjusted to form a sag shape thereby (S1-2). Subsequently, the bonding surface is mirror-polished (S1-3) and cleaned (S1-4). After the cleaning, BOX oxidation is performed (S1-5), and hydrogen ions are implanted (S1-6).

On the other hand, a base wafer is prepared (S2-0) and double-side polished (S2-1). Then, the base wafer is subjected to mirror-polishing of the chamfered surface on the front surface side, mirror-polishing of the chamfered surface on the back surface side, and mirror-polishing of the end face by a prior method for mirror-polishing a chamfered portion (S2-2). Subsequently, the bonding surface is mirror-polished (S2-3), and cleaned (S2-4).

Thus prepared bond wafer and base wafer are subjected to cleaning before bonding (S3), and bonded with each other using each bonding surface, on which the roll-off amount is adjusted (S4). Then, a delamination heat treatment is performed (S5), and the bond wafer is delaminated along the hydrogen-ion implanted layer to produce a bonded wafer (S6).

It is to be noted that the formation of a sag shape by the inventive method for processing a semiconductor wafer may be performed only to the bond wafer in the step (S1-2) as described above, or may be performed only to the base wafer in the step (S2-2) instead. It is also possible to perform the formation to the both wafer in the step (S1-2) and the step (S2-2).

It is also preferable to use a bond wafer and/or a base wafer on which the roll-off amount of the outermost peripheral portion is adjusted to +150 nm or more by the inventive method for processing a semiconductor wafer.

Such inventive method for manufacturing a bonded wafer can manufacture a bonded wafer with suppressing occurrence of defects on the periphery in delaminating a bond wafer by bonding a wafer for bonding on which a desired sag shape is formed on the outermost peripheral portion.

[Method for Manufacturing Epitaxial Wafer]

The present invention also provides a method for manufacturing an epitaxial wafer, comprising flattening of an outermost peripheral portion of a semiconductor wafer by the foregoing method for processing a semiconductor wafer, wherein the semiconductor wafer has an epitaxial layer formed on a front surface thereof, and has a negative roll-off amount of the outermost peripheral portion thereof on a side of the front surface having the epitaxial layer formed thereon.

Figure 8:
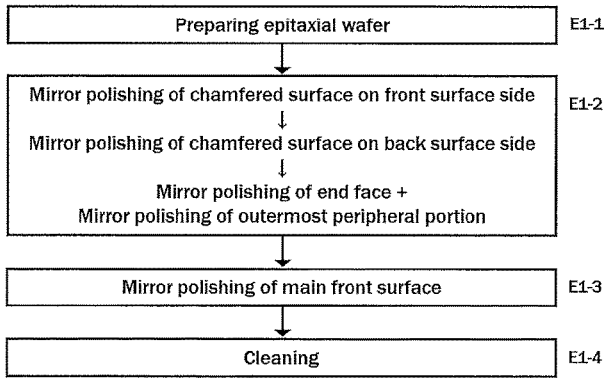
FIG. 8 is a flow diagram showing an example of the inventive method for manufacturing an epitaxial wafer.

The foregoing inventive method for manufacturing an epitaxial wafer is preferably performed in line with a flow of FIG. 8, for example. In the flow of FIG. 8, an epitaxial wafer on which an epitaxial layer is formed on the front surface, and a rise shape (a shape with a negative roll-off amount) is formed on the outermost peripheral portion, is prepared (E1-1) at first. Then, the epitaxial wafer is subjected to mirror-polishing of the chamfered surface on the front surface side, mirror-polishing of the chamfered surface on the back surface side, and one step-performed mirror-polishing of the end face and the outermost peripheral portion by the inventive method for processing a semiconductor wafer, and the rise shape on the outermost peripheral portion of the epitaxial wafer is removed to be flattened thereby (E1-2). Subsequently, the main front surface is subjected to mirror-polishing (E1-3) and cleaning (E1-4).

Figure 9:
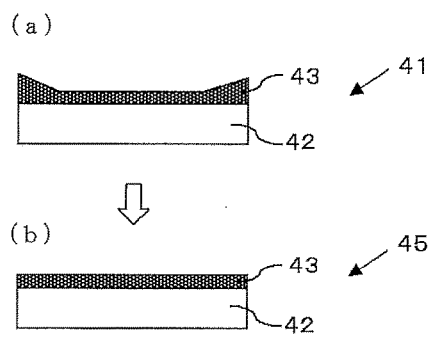
FIG. 9 is a schematic diagram showing removal of a rise shape by the inventive method for manufacturing an epitaxial wafer.

In such a method for manufacturing an epitaxial wafer, by polishing a rise shape, which is formed on the outermost peripheral portion of the epitaxial wafer 41 by forming an epitaxial layer 43 on the front surface of a substrate for epitaxial growth (epi-sub) 42 as shown in FIG. 9 (a), it is possible to control the flatness of the outermost peripheral portion of the epitaxial wafer 41 to manufacture an epitaxial wafer 45 (FIG. 9 (b)).

The present invention further provides a method for manufacturing an epitaxial wafer, comprising: processing a semiconductor wafer by the foregoing method for processing a semiconductor wafer to adjust the outermost peripheral portion on the front surface to have a positive roll-off amount, and forming an epitaxial layer on the front surface of the semiconductor wafer.

Figure 10:
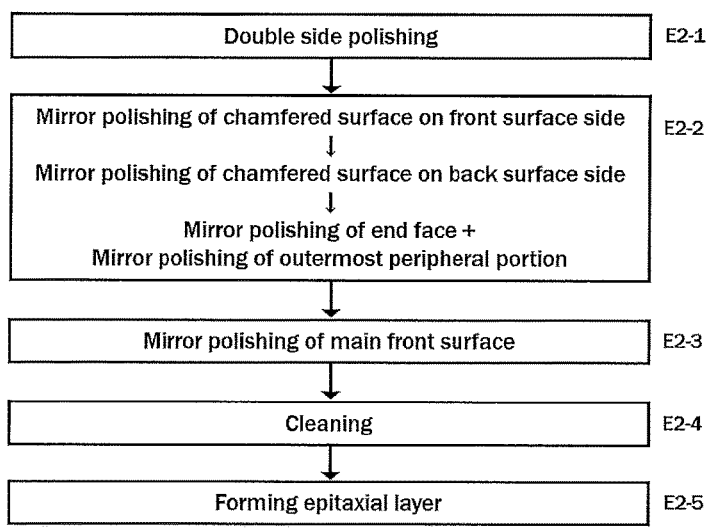
FIG. 10 is a flow diagram showing another example of the inventive method for manufacturing an epitaxial wafer.

The inventive method for manufacturing an epitaxial wafer is preferably performed in line with a flow of FIG. 10, for example. In the flow of FIG. 10, a semiconductor wafer is prepared as a substrate for epitaxial growth, and double-side polished (E2-1) at first. Then, the semiconductor wafer is subjected to mirror-polishing of the chamfered surface on the front surface side, mirror-polishing of the chamfered surface on the back surface side, and one step-performed mirror-polishing of the end face and the outermost peripheral portion by the inventive method for processing a semiconductor wafer, and the roll-off amount of the outermost peripheral portion on the front surface of the semiconductor wafer is adjusted to a positive value (E2-2). That is, a sag shape is formed previously. Subsequently, the main front surface is subjected to mirror-polishing (E2-3) and cleaning (E2-4), and then an epitaxial layer is formed on the front surface of the semiconductor wafer (E2-5).

Figure 11:
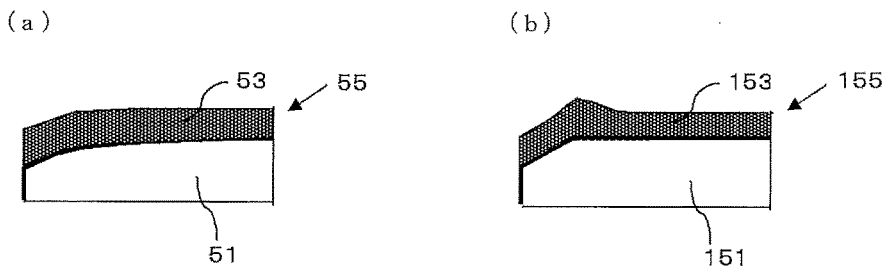
FIG. 11 are schematic cross-sectional views showing each example of the method for manufacturing an epitaxial wafer in which (a) a sag shape is previously formed in a semiconductor wafer by the inventive method for processing a semiconductor wafer, and (b) a sag shape is not formed previously.

As shown in FIG. 11 (*b*), when such a sag shape is not formed on the semiconductor wafer 151, which is a substrate for epitaxial growth, a rise shape is formed on the outermost peripheral portion of the epitaxial wafer 155 caused by formation of the epitaxial layer 153. On the other hand, in the inventive method for manufacturing an epitaxial wafer, a desired sag shape is formed previously on the outermost peripheral portion, which is on the front surface of the semiconductor wafer 51 of a substrate for epitaxial growth and corresponds to the portion where a rise shape is formed when the epitaxial layer 53 is formed. This makes it possible to control the flatness of the outermost peripheral portion of an epitaxial wafer 55 as shown in FIG. 11 (*a*), and to manufacture an epitaxial wafer 55 which does not have a rise shape.

In the present invention, it is also possible to perform a step of forming an epitaxial layer on the front surface of a semiconductor wafer, after the step of mirror-polishing the chamfered surface on the front surface side and the step of mirror-polishing the chamfered surface on the back surface side, and before the one step-performed mirror-polishing of the end face and the outermost peripheral portion on the front surface or the back surface.

Figure 6:
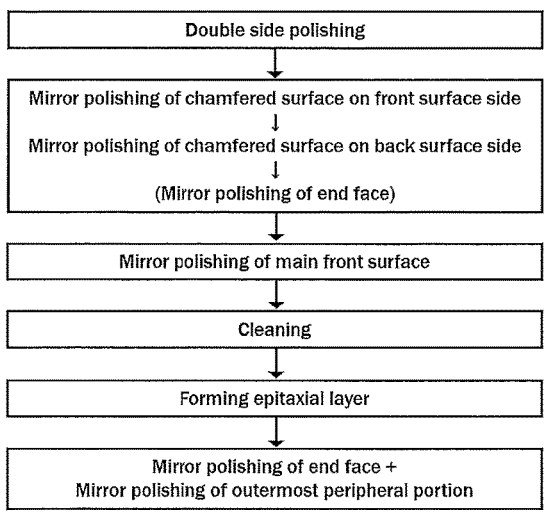
FIG. 6 is a flow diagram showing another example of the inventive method for processing a semiconductor wafer.

More specifically, it can be performed in line with a flow shown in FIG. 6, for example. In the flow of FIG. 6, mirror-polishing of the chamfered surface on the front surface side and mirror-polishing of the chamfered surface on the back surface side are performed after double-side polishing. Then, the end face is mirror-polished if necessary, and after that, the main front surface is mirror-polished and cleaned. Subsequently, an epitaxial layer is formed on the front surface, and then the end face and the outermost peripheral portion are mirror-polished.

Such a method can adjust the roll-off amount of the peripheral portion of an epitaxial wafer when the epitaxial wafer is produced by epitaxial growth on a semiconductor wafer in which the chamfered surface is mirror-polished. Accordingly, it is possible to reduce rise shape, which tends to be formed in an epitaxial wafer, and to obtain an epitaxial wafer with the outermost peripheral portion having a good flatness.

As described above, by applying the inventive method for processing a semiconductor wafer to the manufacture of a bonded wafer, it is possible to manufacture a bonded wafer in which occurrence of defects on the periphery in delaminating a bond wafer is suppressed. It is also possible to manufacture an epitaxial wafer in which the flatness of the outermost peripheral portion is controlled by applying the inventive method for processing a semiconductor wafer to the manufacture of a epitaxial wafer.

EXAMPLE

Hereinafter, the present invention will be more specifically described with reference to Examples and Comparative Examples, but the present invention is not limited thereto.

Examples 1-1 to 1-4, Comparative Example 1-1

On an Si single crystal wafer with a diameter of 300 mm and crystal orientation of <100> having a chamfered portion composed of a chamfered surface on the front surface side, a chamfered surface on the back surface side, and an end face at the peripheral end, the roll-off amount before mirror-polishing was measured with Dynasearch (manufactured by Raytex Corporation). Then, this Si single crystal wafer was subjected to mirror-polishing of the chamfered surface on the front surface side and mirror-polishing of the chamfered surface on the back surface side, and subsequently subjected to mirror-polishing of the end face and mirror-polishing of the outermost peripheral portion on the front surface, and a sag shape was formed thereby. After that, the main front surface was mirror-polished. Incidentally, the mirror-polishing of the end face and the mirror-polishing of the outermost peripheral portion on the front surface were performed with a polishing apparatus in which 12 pieces in total of the polishing pieces (A) to mirror-polish the end face and the polishing pieces (B) to mirror-polish the outermost peripheral portion on the front surface are arranged.

In Examples 1-1 to 1-4 and Comparative Example 1-1, each polishing was performed with a polishing apparatus provided with the polishing pieces (A) and the polishing pieces (B) in numbers described in Table 3. That is, the mirror-polishing of the end face and the outermost peripheral portion on the front surface was performed in one step in each of Examples 1-1 to 1-4. On the other hand, only the end face was mirror-polished in Comparative Example 1-1. In Examples 1-1 to 1-4 and Comparative Example 1-1, each main front surface was mirror-polished for the polishing time (a relative value based on the value in Examples as 100) described in Table 3.

Comparative Examples 1-2 and 1-3

On an Si single crystal wafer with a diameter of 300 mm and crystal orientation of <100> having a chamfered portion composed of a chamfered surface on the front surface side, a chamfered surface on the back surface side, and an end face at the peripheral end, the roll-off amount before mirror-polishing was measured with Dynasearch (manufactured by Raytex Corporation). Then, this Si single crystal wafer was subjected to mirror-polishing of the chamfered surface on the front surface side, mirror-polishing of the chamfered surface on the back surface side, and mirror-polishing of the end face. The main front surface was mirror-polished without mirror-polishing of the outermost peripheral portion on the front surface. In the mirror-polishing of the main front surface, the polishing time was extended to form a sag shape. In Comparative Examples 1-2 and 1-3, the main front surface was mirror-polished for each polishing time (a relative value based on the value in Examples as 100) described in Table 3.

On the wafers of Examples 1-1 to 1-4 and Comparative Examples 1-1 to 1-3, which were mirror-polished as described above, each roll-off amount after mirror-polishing was measured with Dynasearch (manufactured by Raytex Corporation). Each change of roll-off was determined from the difference between the roll-off amount after mirror-polishing and the roll-off amount before mirror-polishing. The results (relative values based on the value in Comparative Example 1-1 as 1) are shown in Table 3.

On the wafers of Examples 1-1 to 1-4 and Comparative Examples 1-1 to 1-3, which were mirror-polished as described above, each SFQRmax was measured with Wafer Sight (manufactured by KLA-Tencor Corporation) in conditions of a cell size of 26 mm×8 mm and removal of the periphery of 3 mm, and each change of SFQRmax was determined thereby. The results (relative values based on the value in Comparative Examples 1-1 as 1) are shown in Table 3.

By using a Si single crystal wafer mirror-polished in each conditions of Examples 1-1 to 1-4 and Comparative Examples 1-1 to 1-3 as a bond wafer and a base wafer, 100 pieces of bonded SOI wafers were produced in each conditions by an ion implantation delamination method. Each defect ratio on the periphery in delaminating a bond wafer (a ratio of SOI wafers in which defect occurred on the periphery) was evaluated. The results are shown in Table 3.

On the other hand, in comparative Example 1-1 using 0 piece of polishing piece (B) to mirror-polish the outermost peripheral portion on the front surface, the defect ratio on the periphery in delaminating a bond wafer was high as shown in Table 3, since a sag shape was not formed.

In each of Comparative Example 1-2 and 1-3, in which the time for polishing the main front surface was extended to form a sag shape, the change of SFQRmax became large, and the flatness was degraded.

Example 2, Comparative Example 2

By using a Si single crystal wafer polished in each conditions of Example 1-4 and Comparative Example 1-1 as a wafer for epitaxial growth, an epitaxial layer was formed in a prescribed growth conditions (growth conditions to form a rise shape of about 5.5 on the outermost peripheral portion of the epitaxial wafer when the epitaxial layer is formed on a Si single crystal wafer on which a sag shape was not formed (the change of roll-off is about −5.5)). As a result, when the Si single crystal wafer was mirror-polished in the conditions of Example 1-4, and the epitaxial layer was formed thereon, the produced epitaxial wafer (Example 2) showed a change of roll-off of +0.1. On the other hand, when the Si single crystal wafer was mirror-polished in the conditions of Comparative Example 1-1, and the epitaxial layer

TABLE 3

| | | Number of pieces | | Time for | | | |
| | Processing method | End face (A) | Outermost peripheral portion (B) | polishing main front surface (relative value) | Change of roll-off (relative value) | Change of SFQRmax (relative value) | Defect ratio on periphery in delaminating bond wafer (%) |
|---|---|---|---|---|---|---|---|
| Example 1-1 | Processing of outermost periphery | 8 | 4 | 100 | 18.9 | 1.7 | 0% |
| Example 1-2 | Processing of outermost periphery | 9 | 3 | 100 | 14.6 | 1 | 0% |
| Example 1-3 | Processing of outermost periphery | 10 | 2 | 100 | 10 | 0.7 | 0% |
| Example 1-4 | Processing of outermost periphery | 11 | 1 | 100 | 5.5 | 1.3 | 3% |
| Comparative Example 1-1 | Processing of outermost periphery | 12 | 0 | 100 | 1 | 1 | 10% |
| Comparative Example 1-2 | Extension of time for polishing main front surface | — | — | 500 | 6.6 | 51 | 1% |
| Comparative Example 1-3 | Extension of time for polishing main front surface | — | — | 700 | 9.3 | 102 | 0% |

As shown in Table 3, in Examples 1-1 to 1-4, the change of roll-off could be adjusted as desired by altering the number of polishing pieces (B) to mirror-polish the outermost peripheral portion on the front surface, and a Si single crystal wafer having a sag shape could be produced without degrading the flatness (without increasing the value of change of SFQRmax).

In Examples 1-1 to 1-4, the defect ratio on the periphery in delaminating a bond wafer could be decreased by forming a sag shape on a wafer for bonding. It is to be noted that when the formed sag shape (the change of roll-off) was larger, the occurrence of defects on the periphery was suppressed.

was formed thereon, the produced epitaxial wafer (Comparative Example 2) showed a change of roll-off of −4.5.

As described above, an epitaxial wafer with an extremely reduced rise shape on the outermost peripheral portion could be obtained by previously forming a sag shape on a wafer for epitaxial growth so as to offset the size of the rise shape formed by epitaxial growth.

Example 3

The epitaxial wafer produced in Comparative Example 2 (change of roll-off: −4.5) was mirror-polished (the outermost peripheral was processed) in the same conditions in Example 1-4. As a result, the outermost peripheral portion of the epitaxial wafer after mirror-polishing showed a change of roll-off of +1.0, that is, an epitaxial wafer with an extremely reduced rise shape on the outermost peripheral portion could be obtained.

As described above, it was revealed that the inventive method for processing a semiconductor wafer can form a desired sag shape on the outermost peripheral portion with high accuracy without deforming the shape of the internal side from the outermost peripheral portion of the semiconductor wafer by adjusting the roll-off amount of the outermost peripheral portion, and can process the semiconductor wafer so as not to have a sharp edge shape after the processing. It was also revealed that a bonded wafer in which occurrence of defects on the periphery in delaminating a bond wafer is suppressed can be manufactured by applying this method for processing a semiconductor wafer to the manufacture of a bonded wafer; and an epitaxial wafer with the outermost peripheral portion thereof having a controlled flatness can be produced by applying such a method for processing a semiconductor wafer to the manufacture of an epitaxial wafer.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for processing a semiconductor wafer having a front surface, a back surface, and a chamfered portion at a peripheral end of the semiconductor wafer, with the chamfered portion including a chamfered surface on a side of the front surface, a chamfered surface on a side of the back surface, and an end face, comprising:
   mirror-polishing of each portion of the chamfered surface on the side of the front surface, the chamfered surface on the side of the back surface, the end face, and an outermost peripheral portion on the front surface or the back surface adjacent to the chamfered surface;
   wherein the mirror-polishing of the end face and the mirror-polishing of the outermost peripheral portion on the front surface or the back surface are performed as a one step-performed mirror-polishing, after a step of mirror-polishing the chamfered surface on the side of the front surface and a step of mirror-polishing the chamfered surface on the side of the back surface, and
   a roll-off amount of the outermost peripheral portion on the front surface or the back surface is adjusted by the one step-performed mirror-polishing of the end face and the outermost peripheral portion.

2. The method for processing a semiconductor wafer according to claim 1, wherein the one step-performed mirror-polishing of the end face and the outermost peripheral portion is performed with a polishing apparatus provided with one or more polishing pieces (A) to mirror-polish the end face and one or more polishing pieces (B) to mirror-polish the outermost peripheral portion on the front surface or the back surface with the both pieces being arranged to surround the semiconductor wafer, by rotating the semiconductor wafer relatively to the polishing pieces (A) and (B).

3. The method for processing a semiconductor wafer according to claim 2, wherein the roll-off amount is adjusted with the polishing apparatus provided with the plurality of polishing pieces (B), and by altering the number of the polishing pieces (B) being in contact with the outermost peripheral portion on the front surface or the back surface.

4. The method for processing a semiconductor wafer according to claim 3, wherein the one step-performed mirror-polishing of the end face and the outermost peripheral portion is performed with the polishing apparatus provided with 12 pieces or more in total of the polishing pieces (A) and the polishing pieces (B).

5. The method for processing a semiconductor wafer according to claim 3, wherein
   the one step-performed mirror-polishing of the end face and the outermost peripheral portion includes measuring of the roll-off amount; and
   if the measured roll-off amount does not coincide with a desired value, the one step-performed mirror-polishing of the end face and the outermost peripheral portion including the measuring of the roll-off amount is repeated while adjusting polishing conditions of the one step-performed mirror-polishing of the end face and the outermost peripheral portion; and then
   if the measured roll-off amount coincides with a desired value, the one step-performed mirror-polishing of the end face and the outermost peripheral portion is finished.

6. The method for processing a semiconductor wafer according to claim 3, further comprising a step of forming an epitaxial layer on the front surface of the semiconductor wafer, after the step of mirror-polishing the chamfered surface on the side of the front surface and the step of mirror-polishing the chamfered surface on the side of the back surface, and before the one step-performed mirror-polishing of the end face and the outermost peripheral portion on the front surface or the back surface.

7. A method for manufacturing a bonded wafer, wherein the bonded wafer is manufactured by an ion implantation delamination method using a semiconductor wafer, with the roll-off amount of the outermost peripheral portion on the front surface or the back surface being adjusted by the method for processing a semiconductor wafer according to claim 3, as either or both of a bond wafer and a base wafer; and using the surface with the roll-off amount being adjusted as a bonding surface.

8. A method for manufacturing an epitaxial wafer, comprising flattening of an outermost peripheral portion of a semiconductor wafer by the method for processing a semiconductor wafer according to claim 3, wherein the semiconductor wafer has an epitaxial layer formed on a front surface thereof, and has a negative roll-off amount of the outermost peripheral portion thereof on a side of the front surface having the epitaxial layer formed thereon.

9. A method for manufacturing an epitaxial wafer, comprising:
   Adjusting the outermost peripheral portion on the front surface to have a positive roll-off amount by processing the semiconductor wafer according to claim 3, and forming an epitaxial layer on the front surface of the front surface of the semiconductor wafer.

10. The method for processing a semiconductor wafer according to claim 2, wherein the one step-performed mirror-polishing of the end face and the outermost peripheral portion is performed with the polishing apparatus provided with 12 pieces or more in total of the polishing pieces (A) and the polishing pieces (B).

11. The method for processing a semiconductor wafer according to claim 2, wherein
   the one step-performed mirror-polishing of the end face and the outermost peripheral portion includes measuring of the roll-off amount; and if the measured roll-off amount does not coincide with a desired value, the one step-performed mirror-polishing of the end face and the outermost peripheral portion including the measuring of the roll-off amount is repeated while adjusting polishing conditions of the one step-performed mirror-polishing of the end face and the outermost peripheral portion; and then if the measured roll-off amount coincides with a desired value, the one step-performed mirror-polishing of the end face and the outermost peripheral portion is finished.

12. The method for processing a semiconductor wafer according to claim 2, further comprising a step of forming an epitaxial layer on the front surface of the semiconductor wafer, after the step of mirror-polishing the chamfered surface on the side of the front surface and the step of mirror-polishing the chamfered surface on the side of the back surface, and before the one step-performed mirror-polishing of the end face and the outermost peripheral portion on the front surface or the back surface.

13. A method for manufacturing a bonded wafer, wherein the bonded wafer is manufactured by an ion implantation delamination method using a semiconductor wafer, with the roll-off amount of the outermost peripheral portion on the front surface or the back surface being adjusted by the method for processing a semiconductor wafer according to claim 2, as either or both of a bond wafer and a base wafer; and using the surface with the roll-off amount being adjusted as a bonding surface.

14. A method for manufacturing an epitaxial wafer, comprising flattening of an outermost peripheral portion of a semiconductor wafer by the method for processing a semiconductor wafer according to claim 2, wherein the semiconductor wafer has an epitaxial layer formed on a front surface thereof, and has a negative roll-off amount of the outermost peripheral portion thereof on a side of the front surface having the epitaxial layer formed thereon.

15. A method for manufacturing an epitaxial wafer, comprising:
Adjusting the outermost peripheral portion on the front surface to have a positive roll-off amount by processing the semiconductor wafer according to claim 2, and forming an epitaxial layer on the front surface of the front surface of the semiconductor wafer.

16. The method for processing a semiconductor wafer according to claim 1, wherein the one step-performed mirror-polishing of the end face and the outermost peripheral portion includes measuring of the roll-off amount; and if the measured roll-off amount does not coincide with a desired value, the one step-performed mirror-polishing of the end face and the outermost peripheral portion including the measuring of the roll-off amount is repeated while adjusting polishing conditions of the one step-performed mirror-polishing of the end face and the outermost peripheral portion; and then if the measured roll-off amount coincides with a desired value, the one step-performed mirror-polishing of the end face and the outermost peripheral portion is finished.

17. The method for processing a semiconductor wafer according to claim 1, further comprising a step of forming an epitaxial layer on the front surface of the semiconductor wafer, after the step of mirror-polishing the chamfered surface on the side of the front surface and the step of mirror-polishing the chamfered surface on the side of the back surface, and before the one step-performed mirror-polishing of the end face and the outermost peripheral portion on the front surface or the back surface.

18. A method for manufacturing a bonded wafer, wherein the bonded wafer is manufactured by an ion implantation delamination method using a semiconductor wafer, with the roll-off amount of the outermost peripheral portion on the front surface or the back surface being adjusted by the method for processing a semiconductor wafer according to claim 1, as either or both of a bond wafer and a base wafer; and using the surface with the roll-off amount being adjusted as a bonding surface.

19. A method for manufacturing an epitaxial wafer, comprising flattening of an outermost peripheral portion of a semiconductor wafer by the method for processing a semiconductor wafer according to claim 1, wherein the semiconductor wafer has an epitaxial layer formed on a front surface thereof, and has a negative roll-off amount of the outermost peripheral portion thereof on a side of the front surface having the epitaxial layer formed thereon.

20. A method for manufacturing an epitaxial wafer, comprising:
Adjusting the outermost peripheral portion on the front surface to have a positive roll-off amount by processing the semiconductor wafer according to claim 1, and forming an epitaxial layer on the front surface of the front surface of the semiconductor wafer.

* * * * *